(12) United States Patent
Nakata et al.

(10) Patent No.: US 7,454,104 B2
(45) Date of Patent: Nov. 18, 2008

(54) OPTICAL MODULE

(75) Inventors: Hidehiko Nakata, Kanagawa (JP);
Takahiro Arakida, Kanagawa (JP);
Terukazu Naruse, Kanagawa (JP);
Miwa Okubo, Kanagawa (JP);
Kazuyoshi Yamada, Tokyo (JP);
Momoko Eguchi, Kanagawa (JP)

(73) Assignee: Sony Corporation, Tokyo (JP)

( * ) Notice: Subject to any disclaimer, the term of this patent is extended or adjusted under 35 U.S.C. 154(b) by 0 days.

(21) Appl. No.: 11/456,730

(22) Filed: Jul. 11, 2006

(65) Prior Publication Data
US 2007/0019902 A1    Jan. 25, 2007

(30) Foreign Application Priority Data
Jul. 19, 2005    (JP)    ............................ P2005-209022

(51) Int. Cl.
*G02B 6/42* (2006.01)
*G02B 6/36* (2006.01)
*H01L 29/04* (2006.01)

(52) U.S. Cl. .............................. 385/40; 385/88; 257/50

(58) Field of Classification Search ................... 385/40
See application file for complete search history.

(56) References Cited

U.S. PATENT DOCUMENTS

| 6,614,964 | B2 * | 9/2003 | Kuhara et al. | .................. 385/49 |
| 6,712,529 | B2 * | 3/2004 | Horio | ........................... 385/92 |
| 2003/0152391 | A1 * | 8/2003 | Kuhara et al. | ............... 398/164 |

* cited by examiner

*Primary Examiner*—Hemang Sanghavi
*Assistant Examiner*—Kajli Prince
(74) *Attorney, Agent, or Firm*—Sonnenschein Nath & Rosenthal LLP

(57) ABSTRACT

An optical module has at least two optical elements mounted in parallel with each other. The module also has a first electrode pad which is formed between the paralleled optical elements and grounded to a ground potential and a second electrode pad which is arranged along a line that is intersected with a direction in which the optical elements are arranged, which faces the first electrode pad and is grounded to the ground potential. The module further has a conductive shield member which is connected to the first electrode pad and the second electrode pad and placed between electrical signal transmission paths each connected to the optical elements.

10 Claims, 5 Drawing Sheets

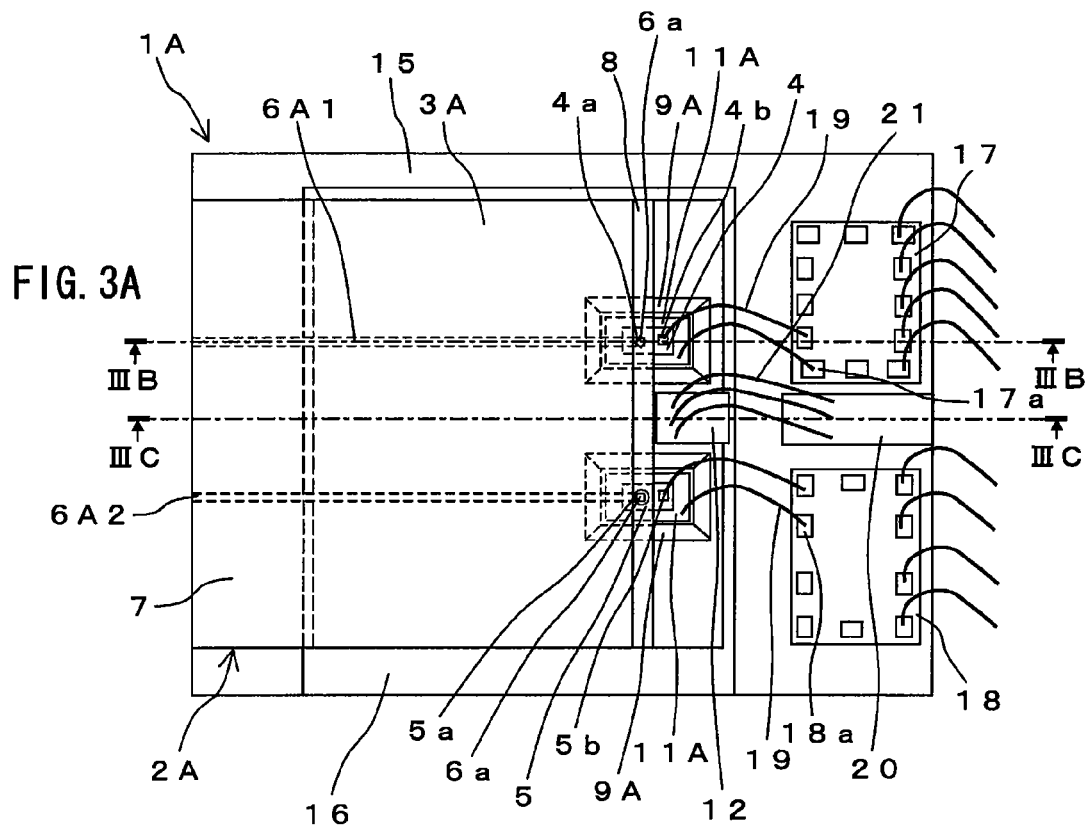
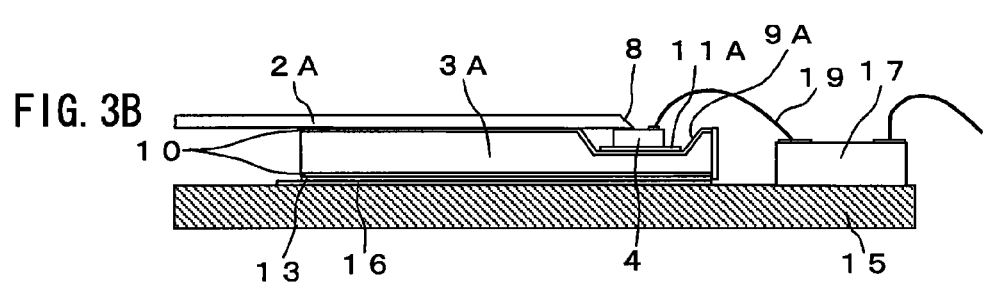
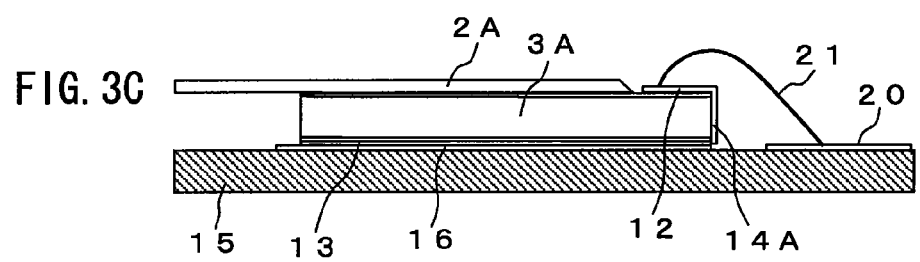

OPTICAL MODULE

CROSS REFERENCE TO RELATED APPLICATION

The present invention contains subject matter related to Japanese Patent Application JP 2005-209022 filed in the Japanese Patent Office on Jul. 19, 2005, the entire contents of which being incorporated herein by reference.

BACKGROUND OF THE INVENTION

1. Field of the Invention

The present invention relates to an optical module on which at least two optical elements are mounted.

2. Description of Related Art

For an optical transmitter module for transmitting an a optical signal or an optical transmitter/receiver module for transmitting/receiving an optical signal, a technology has been proposed for mounting plural optical elements on the same substrate. As a processing speed of a transmission signal by the optical module increases, a crosstalk such that electromagnetic radiation generated from one of optical elements spreads to the other elements to interfere them may occur at the optical module.

A technology has been proposed to increase a distance between these elements to electrically reduce the crosstalk between the optical elements. For an optical transmitter module, a technology has been proposed to increase a distance between light-emitting elements (see article, "10 Gbps×4ch Parallel LD Module" by ANAGURA Masato, conference of Electronics Society in Institute of Electronics, Information and Communication Engineers, C-3-50, p. 160, 2001).

FIG. 1 shows a configuration of an optical transmitter module as related art, which has been disclosed in the article. The optical transmitter module 101A has an optical waveguide 102A in which cores 104A as curved waveguides and light-emitting elements 103 that are apart from each other. Increasing a distance between the adjacent light-emitting elements enables to be reduced a crosstalk between the elements. It is to be noted that a pitch between the light-emitting elements 103 is set to 1 mm.

Further, for an optical transmitter/receiver module, a technology has been proposed to increase a distance between a light-emitting element and a light-receiving element (see Japanese Patent Application Publication No. Hei 10-307238).

FIG. 2 shows a configuration of an optical a transmitter/receiver module as related art, which has been disclosed in the patent publication. The optical transmitter/receiver module 101B has an optical waveguide 102B, a light-emitting element 103, and a light-receiving element 105. The optical waveguide 102B includes a branching core 104B and also has, on its end face, a reflecting mirror 106 to fold back its optical path.

In an optical transmitter/receiver module, electromagnetic radiation generated on the side of a light-emitting element spreads to a light-receiving element to interfere it, which is then subject to any significant crosstalk on an electrical signal due to signal light. Thus, the optical transmitter/receiver module is more sensitive to the crosstalk than the optical transmitter module.

If the optical transmitter/receiver module has such a configuration that a light-emitting element and a light-receiving element are parallel with each other and are separated to an extent as to eliminate an influence of crosstalk, the curved waveguide becomes very long to increase its curvature, so that a module becomes very large. Therefore, in the optical transmitter/receiver module 101B as shown in FIG. 2, the light-emitting element 103 and the light-receiving element 105 are separated from each other so that the reflecting mirror 106 is provided on an end face of the waveguide 102B to fold back its optical path, thereby arranging these elements at the opposite ends of the optical waveguide 102B.

SUMMARY OF THE INVENTION

In a configuration as shown in FIG. 1 such that the optical elements are parallel arranged to separate from each other by an increased distance between them in order to reduce the crosstalk, this increased distance reduces a curvature of a curved waveguide, thus increasing a loss. Therefore, in order to increase the distance between the elements while reducing the loss, it is necessary for a waveguide to elongate, thereby resulting in a large size of the module.

Thus, crosstalk may be insufficiently reduced only by increasing a distance between the optical elements, so that additional measures may be taken against crosstalk.

Moreover, in a configuration as shown in FIG. 2 such that an optical path is folded back to reduce a crosstalk, the reflecting mirror is arranged on the optical path, thereby decreasing an intensity of an optical signal. Further, to reduce the crosstalk sufficiently, it is again necessary to increase a distance between the optical elements, thus resulting in an increased size of a module. Moreover, there is only a small degree of freedom in positions where the optical elements are to be mounted, thus bringing about limitations on design of a circuit substrate for driving the optical elements.

It is desirable to provide an optical module that can reduce the crosstalk without resulting in a large size of the module.

According to an embodiment of the invention, there is provided an optical module. The optical module has at least two optical elements mounted in parallel with each other, a first electrode pad which is formed between the paralleled optical elements and grounded to a ground potential and a second electrode pad which is arranged along a line that is intersected with a direction in which the optical elements are arranged, which faces the first electrode pad and grounded to the ground potential; and a conductive shield member which is connected to the first electrode pad and the second electrode pad and placed between electrical signal transmission paths each connected to the optical elements.

According to an optical module of an embodiment of the present invention, when optical elements are driven, electromagnetic radiation occurs along an electrical signal transmission path connected to the optical elements. Electromagnetic radiation occurred at one of the optical elements does not spread to the electrical signal transmission path of any other optical elements since this electromagnetic radiation is coupled to the shield member that is arranged between the parallel optical elements and connected to the ground potential.

According to an optical module of the embodiment of the present invention, electromagnetic radiation that occurred on any one of optical elements is coupled to a grounded shield member and so does not spread to an electrical signal transmission path of any other optical elements, thereby enabling crosstalk between the elements to be reduced.

Further, even if the parallel optical elements are brought closer to each other, crosstalk between the elements can be reduced, thereby decrease a size of an optical module and increasing a degree of freedom in arrangement of the optical elements. This mitigates restrictions on an electric circuit configuration to realize a simple module structure with less crosstalk.

The concluding portion of this specification a particularly points out and directly claims the subject matter of the present invention. However, those skilled in the art will best understand both the organization and method of operation of the invention, together with further advantages and objects thereof, by reading the remaining portions of the specification in view of the accompanying drawing(s) wherein like reference characters refer to like elements.

BRIEF DESCRIPTION OF THE DRAWINGS

FIG. 3A is a plane view of an optical module as a first embodiment of the invention, for showing a configuration thereof, and FIGS. 3B and 3C are cross-sectional views thereof taken along lines IIIB-IIIB, IIIC-IIIC, respectively, shown in FIG. 3A;

DESCRIPTION OF THE PREFERRED EMBODIMENTS

Figure 1:
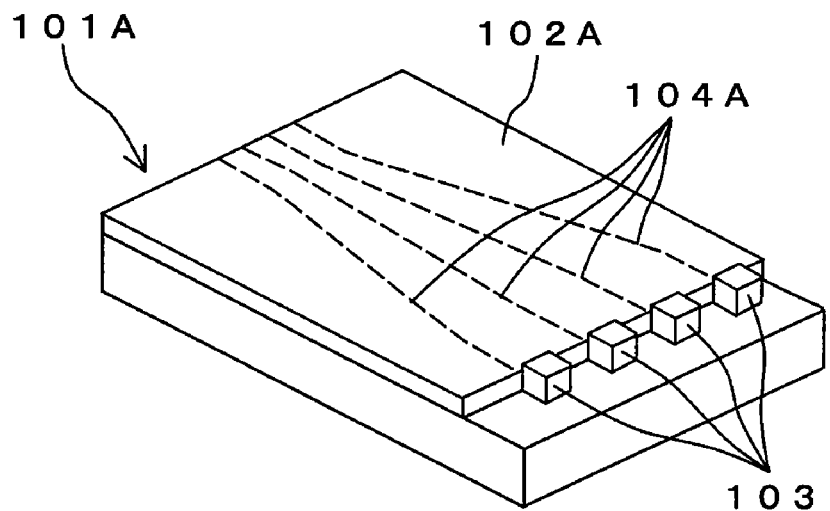
FIG. 1 is a diagram for showing a configuration of an optical transmitter module as related art.
Figure 2:
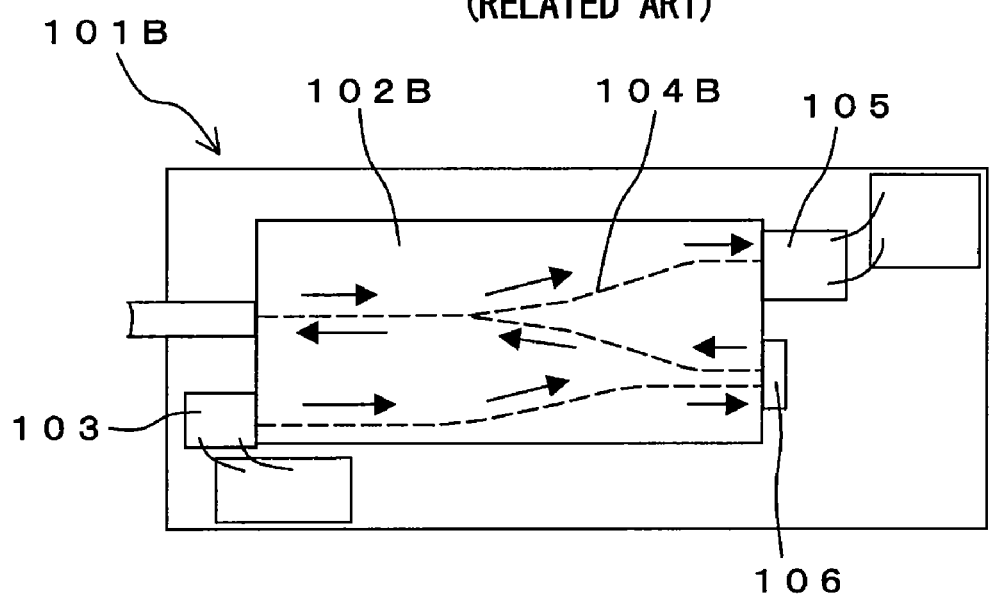
FIG. 2 is a diagram for showing a configuration of an optical transmitter/receiver module as related art.

The following will describe embodiments of an optical module of preferred embodiments of the present invention with reference to drawings.

Configuration of Optical Module according to a First Embodiment

FIGS. 3A-3B are diagrams of a configuration of an optical module according to the first embodiment. FIG. 3A is a plane view of the optical module as a first embodiment of the invention, FIG. 3B is a cross-sectional view thereof taken along a line IIIB-IIIB shown in FIG. 3A, and FIG. 3C is a sectional view thereof taken along a line IIIC-IIIC shown in FIG. 3A.

The optical module 1A of the first embodiment has an optical waveguide sheet 2A having a core/clad structure, a mounting substrate 3A on which the optical waveguide sheet 2A is mounted, and a surface-type light-emitting element 4 such as Vertical Cavity-Surface Emitting Laser (VCSEL) and a surface-type light-receiving element 5 such as Photo Diode (PD) that are mounted on the mounting substrate 3A.

The optical waveguide sheet 2A is one example of optical signal transmission device and made of, for example, a polymer material. The optical waveguide sheet 2A has two straight cores 6A1 and 6A2 extending roughly parallel with each other and a clad 7 that covers the cores 6A1 and 6A2. The light sheet 2A is configured in such a manner that a refractive index of each of the cores 6A1 and 6A2 may be slightly larger than that of the clad 7. This causes light coupled to the cores 6A1 and 6A2 to propagate therethrough with it being confined therein.

The optical waveguide sheet 2A has an inclined end face 8 formed on one side thereof that intersects the cores 6A1 and 6A2. The inclined end face 8 is an oblique plane having an inclination of about 45 degrees with respect to a plane of the optical waveguide sheet 2A, wherein end faces of the cores 6A1 and 6A2 are exposed to form reflecting faces 6a. The reflecting face 6a is formed by exposing the end face of any one of the cores 6A1 and 6A2 to the same plane as the inclined end face 8 and has an inclination of about 45 degrees with respect to an extending direction of the cores 6A1 and 6A2.

Accordingly, light made incident upon a surface of the optical waveguide sheet 2A is reflected by the reflecting face 6a and coupled with the core 6A1 to propagate therethrough and light propagating through the core 6A2 is reflected by the reflecting face 6a and is then emitted from the optical waveguide sheet 2A roughly perpendicularly with respect to a surface of the optical waveguide sheet 2A.

The optical waveguide sheet 2A is directly adhered and fixed to a surface of the mounting substrate 3A. The mounting substrate 3A is made of, for example, silicon (Si) and has an element-mounting concave portion 9A where the surface-type light-emitting element 4 and the surface-type light-receiving element 5 are mounted. The element-mounting concave portion 9A is formed by concaving a part of a surface of the mounting substrate 3A by utilizing anisotropic etching.

The two element-mounting concave portions 9A, 9A are formed at positions that face the reflecting faces 6a, 6a of the cores 6A1, 6A2 in the optical waveguide sheet 2A mounted on the surface of the mounting substrate 3A. In this embodiment, two element-mounting concave portions 9A, 9A are parallel with each other at places pulled in from a rear end of the mounting substrate 3A.

One of the element-mounting concave portions 9A is configured to have an opening large enough to contain the surface-type light-emitting element 4 and a depth a little deeper than its height in order to mount the surface-type light-emitting element 4 thereon. The other element-mounting concave portion 9A is configured to have an opening large enough to contain the surface-type light-receiving element 5 and a depth a little deeper than its height in order to mount the surface-type light-receiving element 5 thereon.

The mounting substrate 3A has insulation films 10, 10, which is made of silicon oxide (SiO2), formed on its right side and back side and also has an element-mounting bonding pad 11A formed on each of the element-mounting concave portions 9A, 9A. On the mounting substrate 3A, the surface-type light-emitting element 4 is mounted in one of the element-mounting concave portions 9A, 9A on which the bonding pad 11A is formed and the surface-type light-receiving element 5 is mounted in the other element-mounting concave portion 9A on which the bonding pad 11A is formed.

The surface-type light-emitting element 4 and the surface-type light-receiving element 5 are each one example of an optical element. The surface-type light-emitting element 4 has a light-emitting portion 4a that emits light. The surface-type light-emitting element 4 is mounted on the element-mounting concave portion 9A at a position that the light-emitting portion 4a faces the reflecting face 6a of the core 6A1 of the optical waveguide sheet 2A. Accordingly, the surface-type light-emitting element 4 is optically coupled with the core 6A1 of the light guide 2A via the reflecting face 6a.

The surface-type light-receiving element 5 has a light-receiving portion 5a to which light is made incident upon. The surface-type light-receiving element 5 is mounted on the other element-mounting concave portion 9A at a position that the light-receiving portion 5a faces the reflecting face 6a of the core 6A2 of the optical waveguide sheet 2A. Accordingly, the surface-type light-receiving element 5 is optically coupled with the core 6A2 of the light guide 2A via the reflecting face 6a.

Then, the surface-type light-emitting element 4 and the surface-type light-receiving element 5 are fixed to the bonding pad 11A by using a conductive adhesive agent or through soldering so that a back-surface electrode, not shown, of each of the surface-type light-emitting element 4 and the surface-type light-receiving element 5 may be electrically connected to the bonding pad 11A.

On a surface of the mounting substrate 3A, a first ground potential electrode pad 12 is formed between the element-mounting concave portions 9A, 9A. The first ground potential electrode pad 12 is one example of a first electrode pad and has such a shape as to extend from a position between the element-mounting concave portions 9A, 9A to the read end of the mounting substrate 3A. It is to be noted that the first ground potential electrode pad 12 and each of the bonding pads 11A can be manufactured on the surface of the mounting substrate 3A by the same step.

The mounting substrate 3A has a grounding electrode 13 formed all over the back surface, so that the first ground potential electrode pad 12 formed on the surface of the mounting substrate 3A and the grounding electrode 13 formed on the back surface of the mounting substrate 3A are electrically connected to each other through a conducting electrode 14A formed at the rear end of the mounting substrate 3A. The conducting electrode 14A is constituted of an electrode pattern formed on the end surface on a side of the rear end of the mounting substrate 3A and has its upper side connected to the first ground potential electrode pad 12 and its lower end connected to the grounding electrode 13.

The mounting substrate 3A mounting the optical waveguide sheet 2A, the surface-type light-emitting element 4 and the surface-type light-receiving element 5 is then installed on an electric circuit substrate 15.

The electric circuit substrate 15 has a circuit substrate ground potential electrode pad 16 formed on its surface. The circuit substrate ground potential electrode pad 16 is one example of a ground electrode and has at least the same size as the grounding electrode 13 formed all over the back surface of the mounting substrate 3A and is grounded (GND) through a bonding wire etc., which are not shown.

The mounting substrate 3A is placed on the circuit substrate ground potential electrode pad 16 on the electric circuit substrate 15 and fixed thereto by using a conductive adhesive or through soldering, so that the grounding electrode 13 of the mounting substrate 3A and the circuit substrate ground potential electrode pad 16 of the electric circuit substrate 15 are electrically connected to each other.

As described above, the first ground potential electrode pad 12 on the mounting substrate 3A is electrically connected to the grounding electrode 13. The grounding electrode 13 is formed all over the back surface of the mounting substrate 3A so as to be in contact with the circuit substrate ground potential electrode pad 16 all over a back surface thereof.

According to such a configuration, the first ground potential electrode pad 12 is connected to the circuit substrate ground potential electrode pad 16 on the electric circuit substrate 15 through a large area. Accordingly, the first ground potential electrode pad 12 has no frequency dependency and functions as a good ground pad at a high frequency too.

On the electric circuit substrate 15, adjacent to the mounting substrate 3A, a driver integrated circuit (IC) 17 is mounted behind the surface-type light-emitting element 4 and a receiver IC 18 is mounted behind the surface-type light-receiving element 5.

The surface-type light-emitting element 4 and the driver IC 17 are connected to each other in such a manner that an electrode pad 4b on the surface of the surface-type light-emitting element 4 and the bonding pad 11A connected with a back surface electrode, not shown, of the surface-type light-receiving element 4 are connected to an electrode pad 17a on a surface of the driver IC 17 through a bonding wire 19. The bonding wire 19 is one example of an electrical signal transmission path and made of, for example, gold (Au) and connected to the surface-type light-emitting element 4 and the driver IC 17 by wire bonding.

Similarly, the surface-type light-receiving element 5 and the receiver IC 18 are connected to each other in such a manner that an electrode pad 5b on the surface of the surface-type light-receiving element 5 and the bonding pad 11A connected with a back surface electrode, not shown, of the surface-type light-receiving element 5 are connected to an electrode pad 18a on the surface of the receiver IC 18 through the bonding wire 19.

The electric circuit substrate 15 has a second ground potential electrode pad 20 formed on it independently of the circuit substrate ground potential electrode pad 16. The second ground potential electrode pad 20 is one example of a second electrode pad and formed at a position that faces the first ground potential electrode pad 12 in such a direction as to intersect with a direction in which the surface-type light-emitting element 4 and the surface-type light-receiving element 5 are arranged. In the present embodiment, the second ground potential electrode pad 20 is formed on a position between the driver IC 17 and the receiver IC 18 on the surface of the electric circuit substrate 15 and grounded through a bonding wire etc.

The first ground potential electrode pad 12 on the mounting substrate 3A and the second ground potential electrode 20 on the electric circuit substrate 15 are connected to each other by a bonding wire 21. The bonding wire 21 is one example of a shield member and is made, for example, gold (Au) and has its one end connected to the first ground potential electrode pad 12 and the other end thereof connected to the second ground potential electrode pad 20. The first ground potential electrode pad 12 is grounded through the grounding electrode 13 and the circuit substrate ground potential electrode pad 16 and the second ground potential electrode pad 20 is also grounded, so that the bonding wire 21 is connected to the ground potential.

The bonding wire 21 is stretched at almost the same height as the bonding wire 19 that connects the surface-type light-emitting element 4 and the driver IC 17 and the surface-type light-receiving element 5 and the receiver IC 18. Further, although the number of the bonding wires 21 may be singular, the number thereof may be plural; in the present embodiment, the three bonding wires 21 are stretched roughly parallel with each other.

Example of Operations of Optical Module of First Embodiment

The following will describe an example of operations of the optical module of the first embodiment. An electrical signal output from the driver IC 17 passes through the bonding wire 19 and enters the surface-type light-emitting element 4 where an electrical signal is converted into an optical signal and issued therefrom.

The optical signal is emitted from the surface-type light-emitting element 4 roughly perpendicularly to the mounting substrate 3A and enters the optical waveguide sheet 2A through its lower surface. The optical signal made incident upon the lower surface of the optical waveguide sheet 2A roughly perpendicularly is reflected by the reflecting face 6a and coupled with one of the cores 6A1 to propagate through it.

In contrast, another optical signal propagating through the other core 6A2 is reflected by the reflecting face 6a and issued from the lower surface of the optical waveguide sheet 2A roughly perpendicularly. The optical signal issued roughly perpendicularly from the lower surface of the optical waveguide sheet 2A is made incident upon the surface-type light-receiving element 5 to be converted into an electrical signal. The electrical signal output from the surface-type light-receiving element 5 passes through the bonding wire 19 to enter the receiver IC 18.

Accordingly, the optical module 1A constitutes a parallel transmitter/receiver module that has a function to transmit an optical signal emitted from the surface-type light-emitting element 4 through the core 6A1 of the optical waveguide sheet 2A and has a function to receive an optical signal from the other core 6A2 by using the surface-type light-receiving element 5.

The optical module 1A thus having a light-emitting element and a light-receiving element, for example, the surface-type light-emitting element 4 and the surface-type light-receiving element 5 encounters electromagnetic radiation generated from the bonding wire 19 when an electrical signal that drives the surface-type light-emitting element 4 is sent from the driver IC 17 to the surface-type light-emitting element 4 via the bonding wire 19. In a related optical module, electromagnetic radiation generated from the transmission-side bonding wire 19 connecting the surface-type light-emitting element 4 and the driver IC 17 to each other has been coupled with the reception-side bonding wire connecting the light-receiving element and the receiver IC to each other, thus resulting in a crosstalk.

In contrast, in the optical module 1A of the present embodiment, by stretching the bonding wire 21 connected to the ground potential between the transmission-side bonding wire 19 and the reception-side bonding wire 19, electromagnetic radiation generated from the transmission-side bonding wire 19 is coupled with the bonding wire 21 stretched between the transmissions-side bonding wire 19 and the reception-side bonding wire 19.

Accordingly, electromagnetic radiation generated by the transmission-side bonding wire 19 is not propagated to the reception-side bonding wire 19 to reduce the crosstalk. Further, the bonding wire 21 is connected to the ground potential, so that the coupled electromagnetic radiation has no influence on the surface-type light-receiving element 5 or the receiver IC 18.

To efficiently couple the electromagnetic radiation generated from the transmission-side bonding wire 19 and propagated to the reception-side bonding wire 19 with the bonding wire 21, this wire 21 is stretched at almost the same height as the transmission-side and reception-side binding wires 19 by aligning it in height with respect to the transmission-side and reception-side binding wires 19 and the cross-talk-reducing bonding wire 21.

The larger the number of the bonding wires 21 is, the higher the effects of reducing crosstalk become; in fact, in the present embodiment, the three bonding wires 21 are stretched in consideration of sizes of the first ground potential electrode pad 12 and the second ground potential electrode pad 20, workability of wire bonding, etc.

Figure 4A:
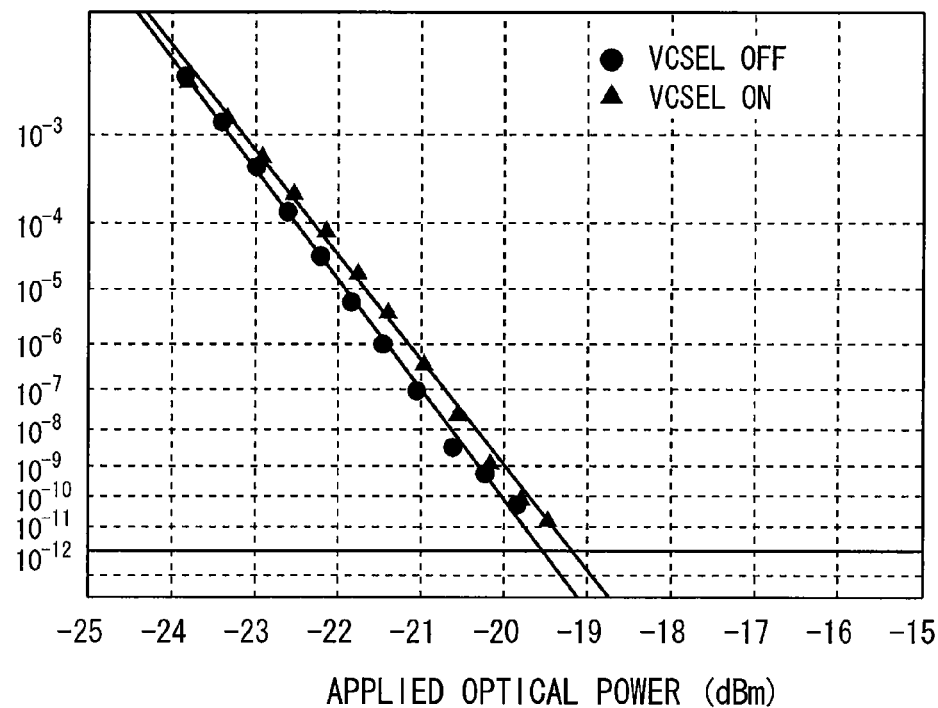
FIGS. 4A and 4B are graphs for showing results of measuring a light-receiving sensitivity owing to whether or not crosstalk prevention measures according to embodiments of the present invention are taken.
Figure 4B:
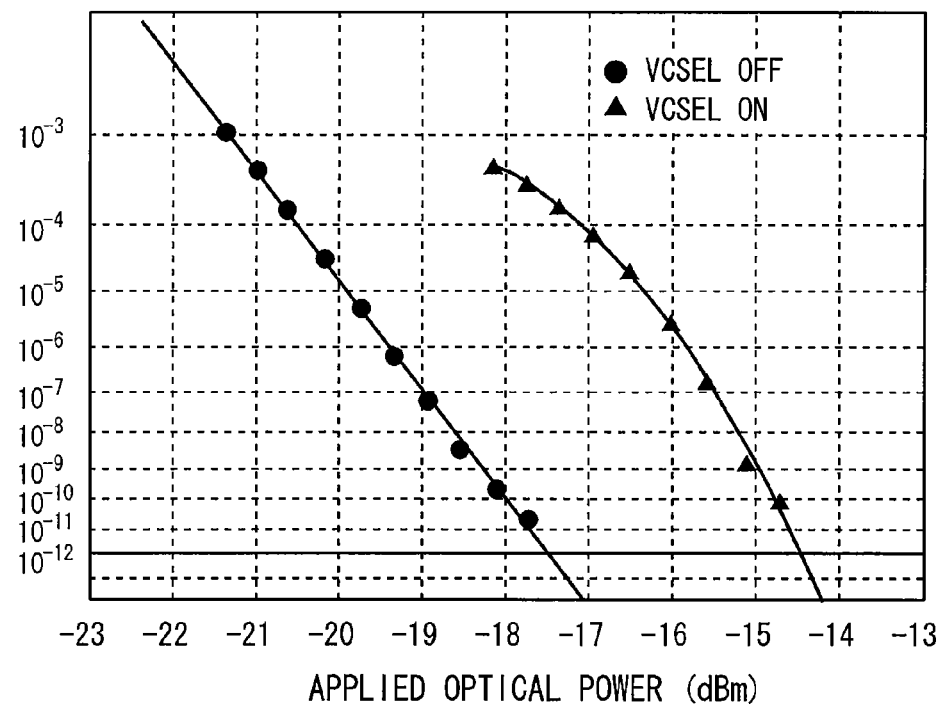

FIGS. 4A and 4B are graphs showing a result of measuring a light-receiving sensitivity owing to whether crosstalk prevention measures of the embodiment of the present invention are taken, which result was obtained by checking effects of the embodiment of the present invention by using an optical transmitter/receiver module in which a surface-type light-emitting element and a surface-type light-receiving element were arranged in parallel with each other.

FIG. 4A shows a result of measuring a bit error ratio (BER) of a reception system when the surface-type light-emitting element was driven (VCSEL ON) and when it was not driven (VCSEL OFF) in a case where crosstalk prevention measures according to the embodiment of the present invention were taken. FIG. 4B shows, for comparison, a result of measurement in a case where the crosstalk prevention measures of the embodiment of the present invention were not taken.

In the case where the crosstalk prevention measures were not taken, a light reception sensitivity of $BER<10^{-12}$ deteriorated by about 3 dB when the surface-type light-emitting element was driven. In contrast, by taking the crosstalk prevention measures of the embodiment of the present invention, the light reception sensitivity deteriorated by 0.5 dB when the surface-type light-emitting element was driven, confirming an effect of reducing the crosstalk by about 2.5 dB.

As described above, in the optical module 1A of the first embodiment, by stretching the bonding wire 21 connected to the ground potential between the surface-type light-emitting element 4 and the surface-type light-receiving element 5, crosstalk between the elements can be reduced. Accordingly, even if the surface-type light-emitting element 4 and the surface-type light-receiving element 5 arranged in parallel with each other are brought closer to each other, crosstalk between these elements can be reduced, thereby miniaturizing the optical module. For example, even if a distance between the surface-type light-emitting element 4 and the surface-type light-receiving element 5 is decreased to about 600 μm, crosstalk between them can be reduced.

Further, a degree of freedom of arrangement of the surface-type light-emitting element 4 and the surface-type light-receiving element 5 is increased, so that limitations on an electric circuit configuration etc. are also mitigated.

Moreover, the first ground potential electrode pad 12 which is formed on the surface of the mounting substrate 3A and to which the crosstalk-reducing bonding wire 21 is connected is connected to the grounding electrode 13 formed on the back surface of the mounting substrate 3A by forming the conducting electrode 14A at the rear end of the mounting substrate 3A, so that the first ground potential electrode pad 12 is connected with the circuit substrate ground potential electrode pad 16 on the electric circuit substrate 15 in a large area.

Thus, the first ground potential electrode pad 12 on the surface of the mounting substrate 3A can function as a good ground pad having no frequency dependency at a high frequency too, so that electromagnetic radiation is coupled with the bonding wire 21 to improve an effect of reducing the crosstalk.

Configuration Example of Optical Module of Second Embodiment

Figure 5A:
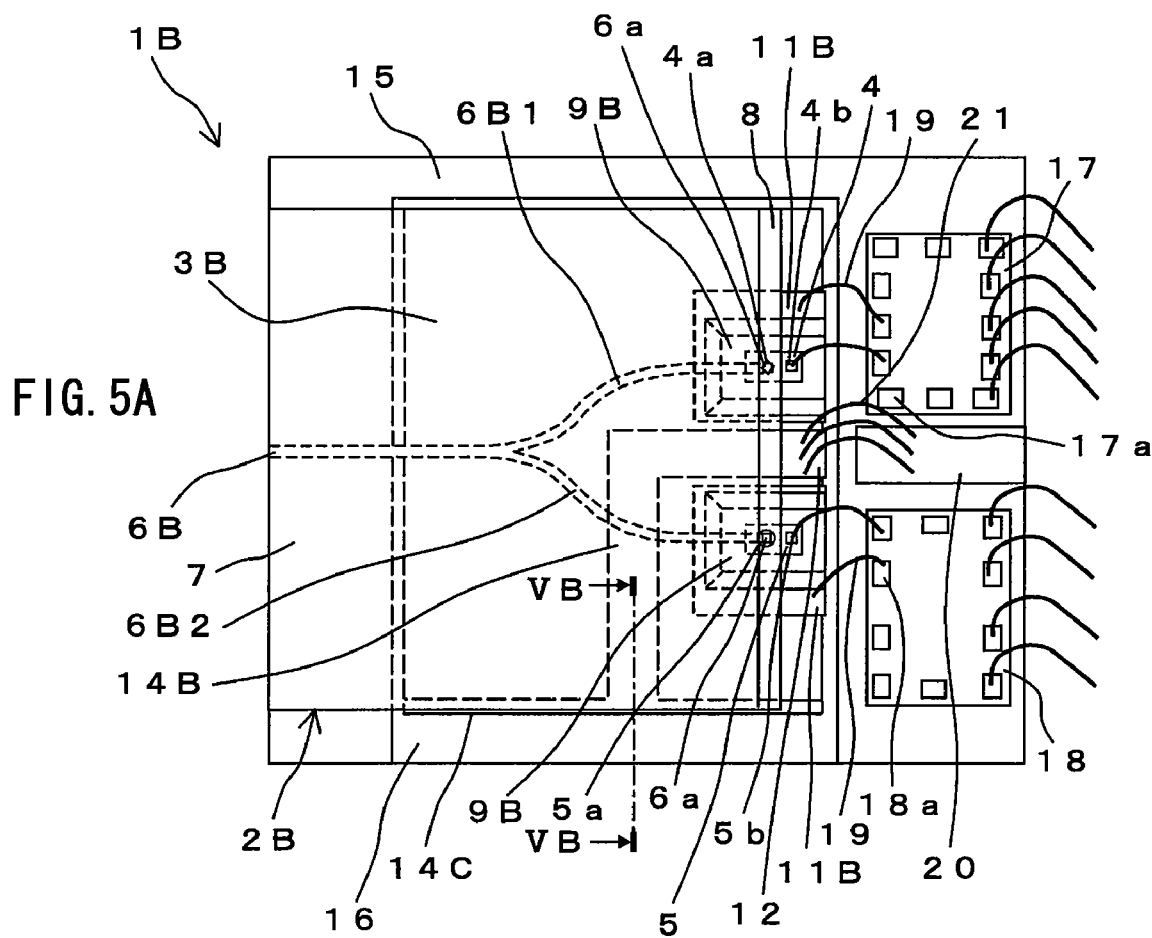
FIG. 5A is a plane view of an optical module as a second embodiment of the invention, for showing a configuration thereof.
Figure 5B:
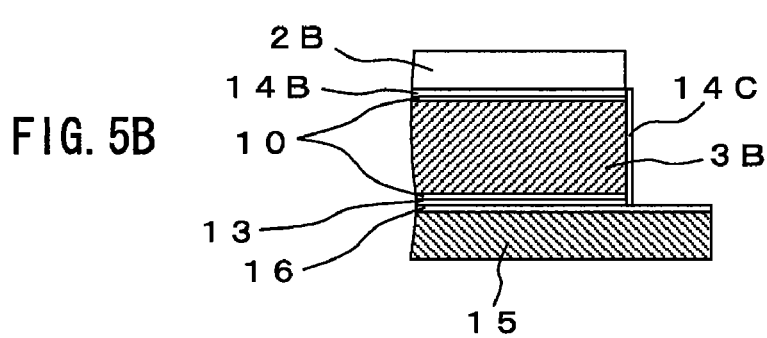
FIG. 5B is a cross-sectional view thereof taken along a line VB-VB shown in FIG. 5A.

FIGS. 5A and 5B show a configuration of an optical module of the second embodiment of the invention. FIG. 5A is a plan view of the optical module 1B and FIG. 5B is a cross-sectional view taken along a line VB-VB of FIG. 5A.

An optical module 1B of the second embodiment has an optical waveguide sheet 2B with a core/clad structure, a mounting substrate 3B on which the optical waveguide sheet 2B is mounted, and a surface-type light-emitting element 4 and a surface-type light-receiving element 5 that are mounted on the mounting substrate 3B.

In the optical module 1B of the second embodiment, the optical waveguide sheet 2B has a Y-branched core in which one core 6B spreads into two cores 6B1 and 6B2. In the optical waveguide sheet 2B, on one side that the branched cores 6B1 and 6B2 intersect, an inclined end face 8 is formed. The cores 6B1 and 6B2 are exposed on the inclined end face 8, to form a reflecting face 6a.

To the branched core 6B1, the surface-type light-emitting element 4 is coupled via the reflecting face 6a, and to the branched core 6B2, the surface-type light-receiving element 5 is coupled via the reflecting face 6a, so that an optical signal output from the surface-type light-emitting element 5 is combined with an optical signal input to the surface-type light-receiving element 5 into the one core 6B. Accordingly, a one-core-double type optical module is configured in which optical signals are transmitted/received by one optical fiber.

Further, in the optical module 1B, on the mounting substrate 3B, each of the element-mounting concave portions 9B, 9B on which the surface-type light-emitting element 4 and the surface-type light-receiving element 5 are mounted is formed close to a rear end of the mounting substrate 3B. In the present embodiment, the rear end of the mounting substrate 3B intersects each of the element-mounting concave portions 9B, 9B.

Accordingly, positions on which the surface-type light-emitting element 4 and the surface-type light-receiving element 5 are mounted are brought close to the rear end of the mounting substrate 3B. This enables a distance between the surface-type light-emitting element 4 and a driver IC 17 and a distance between the surface-type light-receiving element 5 and a receiver IC 18 to be shortened.

By thus shortening the distance between the surface-type light-emitting element 4 and the driver IC 17 and the distance between the surface-type light-receiving element 5 and the receiver IC 18, a bonding wire 19 connecting the surface-type light-emitting element 4 and the driver IC 17 and another bonding wire 19 connecting the surface-type light-receiving element 5 and the receiver IC 18 can be shortened.

This is because the bonding wire 19, if it is long, deteriorates greatly when a high-frequency signal is transmitted through it so that the bonding wire 19 may be preferably configured as short as possible.

Further, this is because if the bonding wire 19 is long when a signal is transmitted at a high frequency, electromagnetic radiation generated on the transmission-side bonding wire 19 is increased, which bring about any increase in crosstalk due to the electromagnetic radiation so that the bonding wire 19 may be preferably configured as short as possible.

Moreover, in the optical module 1B, on the mounting substrate 3B, bonding pads 11B formed in the element-mounting concave portions 9B, 9B are respectively formed so as to extend to a surface of the mounting substrate 3B. Then, the bonding wires 19 are connected to the bonding pads 11B on the side of the surface of the mounting substrate 3B. With this, a height of a position where each of the bonding wires 19 is connected to the electrode pad is roughly equalized to each other to align wire bonding heights, thereby improving workability of wire bonding.

As described above, in the optical module 1B, the bonding pad 11B formed in each of the element-mounting concave portions 9B, 9B is extended up to the surface of the mounting substrate 3B in such a shape that the rear end of the mounting substrate 3B may intersect each of the element-mounting concave portions 9B, 9B, so that each of the bonding pads 11B connected with the surface-type light-emitting element 4 and the surface-type light-receiving element 5 reaches the read end of the mounting substrate 3B.

Therefore, if a first ground potential electrode pad 12 formed on the surface of the mounting substrate 3B and a grounding electrode 13 formed all over the back surface of the mounting substrate 3B are connected to each other by forming a conducting electrode 14 on a rear end of the mounting substrate as in the case of the optical module 1A of the first embodiment, the bonding pad 11B also is connected to a ground potential.

If such a configuration is employed that the conducting electrode is formed at the rear end of the mounting substrate to make the first ground potential electrode pad 12 and the grounding electrode 13 conductive to each other, in order to prevent the bonding pad 11B from connecting to the conducting electrode, it is necessary to mask the conducting electrode so that it disconnects the bonding pad 11B and then form the conducting electrode on the rear end of the mounting substrate, thus resulting in an increase in numbers of steps to be performed.

Therefore, in the optical module 1B of the second embodiment, a conducting electrode 14B that connects the first ground potential electrode pad 12 and extends to one side end of the mounting substrate 3B is formed on the surface of the mounting substrate 3B.

Then, by forming a conducting electrode 14C by sputtering or evaporation on the end face of one of the side ends of the mounting substrate 3B, the first ground potential electrode pad 12 formed on the surface of the mounting substrate 3B is connected with the grounding electrode 13 formed all over the back surface of the mounting substrate 3B. It is to be noted that the first ground potential electrode pad 12 formed on the surface of the mounting substrate 3B, the conducting electrode 14B, and the bonding pads 11B can be manufactured by the same step.

Such a configuration makes it possible to easily connect the first ground potential electrode pad 12 on the surface side of the mounting substrate 3B to the ground potential of an electric circuit substrate 15.

Example of Operations of Optical Module of Second Embodiment

The following will describe an example of operations of the optical module of the second embodiment. An electrical signal output from the driver IC 17 passes through the bonding wire 19 and enters the surface-type light-emitting element 4. The surface-type light-emitting element 4 in turn converts the electrical signal into an optical signal and emits it.

The optical signal is emitted from the surface-type light-emitting element 4 roughly perpendicularly to the mounting substrate 3B and enters into the optical waveguide sheet 2B through its lower surface. The optical signal made incident upon the lower surface of the optical waveguide sheet 2B roughly perpendicularly is reflected by the reflecting face 6a and coupled to the one branched core 6B1, thereby propagating from the core 6B1 to the core 6B.

In contrast, another optical signal propagating through the other core 6B2 branching from the core 6B is reflecting face 6a and issued from the lower surface of the optical waveguide sheet 2B roughly perpendicularly. This optical signal issued from the lower surface of the optical waveguide sheet 2B roughly perpendicularly impinges on the surface-type light-receiving element 5 where it is converted into an electrical signal. The electrical signal output from the surface-type light-receiving element 5 is transferred through the bonding wire 19 to the receiver IC 18.

Accordingly, the optical module 1B constitutes a one-core double type transmitter/receiver module that has a function to transmit an optical signal from the surface-type light-emitting element 4 through the core 6B of the optical waveguide sheet 2B and has a function to receive an optical signal entered from the same core 6B by using the surface-type light-receiving element 5.

Like the optical module 1A of the first embodiment, the optical module 1B having the surface-type light-emitting element 4 and the surface-type light-receiving element 5 generate electromagnetic radiation from the bonding wire 19 when an electrical signal that drives the surface-type light-emitting element 4 is sent from the driver IC 17 to the surface-type light-emitting element 4 through the bonding wire 519.

Therefore, in the optical module 1B also, by stretching the bonding wire 21 connected to the ground potential between the transmission-side bonding wire 19 and the reception-side bonding wire 19, electromagnetic radiation generated by the transmission-side bonding wire 19 is coupled with the bonding wire 21 stretched between the transmission-side and the reception-side bonding wires 19.

Accordingly, electromagnetic radiation generated by the transmission-side bonding wire 19 does not propagate to the reception-side bonding wire 19 to reduce crosstalk. Further, the bonding wire 21 is connected to the ground potential, so that the coupled electromagnetic radiation has no influence on the surface-type light-receiving element 5 or the receiver IC 18.

As described above, in the optical module 1B of the second embodiment also, by stretching the bonding wire 21 connected to the ground potential between the surface-type light-emitting element 4 and the surface-type light-receiving element 5, crosstalk between these elements can be reduced to obtain the same effects as the optical module 1A of the first embodiment.

Further, even if the paralleled surface-type light-emitting element 4 and the surface-type light-receiving element 5 are brought close to each other, crosstalk between the elements can be reduced and a curvature can be increased even if using a curved waveguide, thereby reducing a loss.

Moreover, the waveguide is not lengthened, so that the optical module 1B can be miniaturized.

Configuration of Optical Module of Third Embodiment

Figure 6A:
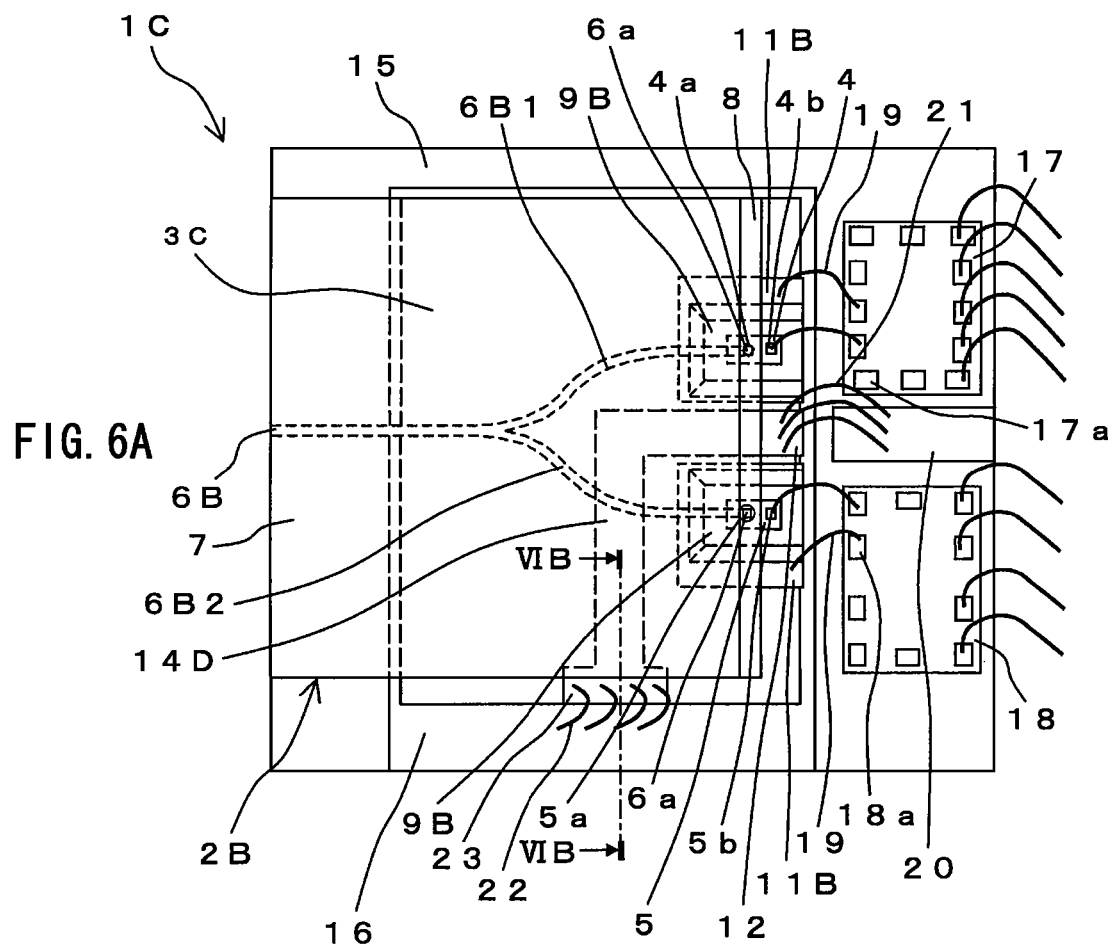
FIG. 6A is a plane view of an optical module as a third embodiment of the invention, for showing a configuration thereof.
Figure 6B:
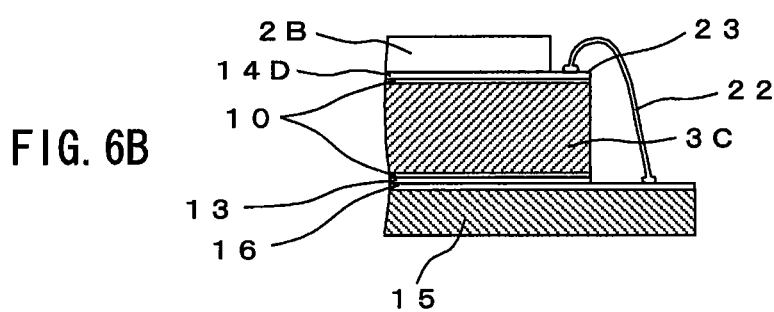
FIG. 6B is a cross-sectional view thereof taken along a line VIB-VIB shown in FIG. 6A.

FIGS. 6A and 6B show a configuration of an optical module of the third embodiment of the invention. FIG. 6A is a plan view of the optical module 1C and FIG. 6B is a cross-sectional view thereof taken along a line VIB-VIB of FIG. 6A.

In an optical module 1C of the third embodiment, a first ground potential electrode pad 12 and a circuit substrate ground potential electrode pad 16 are connected to each other by a bonding wire 22 instead of forming electrode patterns on an end face of a mounting substrate.

Supposing that the optical module 1C of the third embodiment has the same configuration as the optical module 1B of the second embodiment except that the first ground potential electrode pad 12 and the circuit substrate ground potential electrode pad 16 are connected to each other, like reference characters refer to like elements in the second embodiment.

In the optical module 1C of the third embodiment, the first ground potential electrode pad 12 is formed on a surface of a mounting substrate 3C and a conducting electrode 14D connecting to the first ground potential electrode pad 12 is formed on the surface of the mounting substrate 3C. The conducting electrode 14D extends to a direction of one of the side ends of the mounting substrate 3C to form a ground pad 23 at a position where the electrode 14D is exposed from a optical waveguide sheet 2B, thereby making the first ground potential electrode pad 12 and the ground pad 23 conductive to each other via the conducting electrode 14D.

The first ground potential electrode pad 12 on the mounting substrate 3C and the circuit substrate ground potential electrode pad 16 on an electric circuit substrate 15 are connected to each other by a bonding wire 22. The bonding wire 22 is made of, for example, gold (Au) and has its one end connected to the ground pad 23 by wire bonding and the other end thereof connected to the circuit substrate ground potential electrode pad 16.

Accordingly, the first ground potential electrode pad 12 is connected to the ground via the bonding wire 22 and the circuit substrate ground potential electrode pad 16. The number of the bonding wires 23 is, for example, at least two; in the present embodiment, the four bonding wires 23 are stretched substantially in parallel with each other. Although in FIG. 4, the ground pad 23 has been formed approximately at a middle of the mounting substrate 3C to arrange the plural bonding wires 22 close to each other, the ground pad 23 may be formed in a length direction of the mounting substrate 3C to arrange the plural bonding wires 22 with a spacing therebetween in the length direction of the mounting substrate 3C.

The optical module 1C of the third embodiment has such a configuration to thereby enable to be performed in the same process a step of binding a wire between each optical element and the driver IC or the receiver IC, a step of connecting the first ground potential electrode pad 12 and the second ground potential electrode pad 20 to each other, and a step of connecting the ground pad 23 connected with the first ground potential electrode pad 12 and the circuit substrate ground potential electrode pad 16 to each other. This enables the first ground potential electrode pad 12 on the surface side of the mounting substrate 3C to be simply connected to the ground potential of the electric circuit substrate 15.

Further, to the first ground potential electrode pad 12, a crosstalk-reducing bonding wire 21 is connected, so that by forming the ground pad 23 connected via the conducting electrode 14D at a position different from a place where the first ground potential electrode pad 12 is formed, the grounding bonding wire 22 is connected to the ground pad 23. Accordingly, the bonding wire 22 can be connected at a position different from a position where the bonding wire 21 is connected to the first ground potential electrode pad 12, thereby eliminating complicated control etc. in the wire bonding step.

Example of Operations of Optical Module of Third Embodiment

The optical module 1C of the third embodiment performs the same operations as those of the optical module 1B of the second embodiment when transmitting/receiving an optical signal. In the optical module 1C of the third embodiment, electromagnetic radiation is generated from a bonding wire 19 when an electrical signal that drives a surface-type light-emitting element 4 is sent from a driver IC 17 to the surface-type light-emitting element 4 through the bonding wire 19.

Therefore, in the optical module 1C, by stretching a bonding wire 21 connected to the ground potential between the transmission-side bonding wire 19 and the reception-side bonding wire 19, electromagnetic radiation generated by the transmission-side bonding wire 19 is coupled with the bonding wire 21 stretched between the transmission-side and the reception-side bonding wires 19.

Accordingly, electromagnetic radiation generated by the transmission-side bonding wire 19 does not propagate to the a reception-side bonding wire 19 to reduce crosstalk. Further, as the bonding wire 21 is connected to the ground potential, the coupled electromagnetic radiation has no influence on the surface-type light-receiving element 5 or a receiver IC 18.

As described above, in the optical module 1C of the third embodiment also, by stretching the bonding wire 21 grounded to the ground potential between the surface-type light-emitting element 4 and the surface-type light-receiving element 5, crosstalk between these elements can be reduced to obtain the same effects as those of the optical module 1A of the first embodiment and the optical module 1B of the second embodiment.

Further, the first ground potential electrode pad 12 formed on the mounting substrate 3C and the circuit substrate ground potential electrode pad 16 formed on the electric circuit substrate 15 can be connected to each other in the same process as a step of bonding a wire between the optical element and the driver IC, so that the manufacturing process can be simplified.

Modification of Optical Module of Each Embodiment

Although the optical module 1A of the above first embodiment, the optical module 1B of the above second embodiment, and the optical module 1C of the above third embodiment have been described with reference to an example of an optical transmitter/receiver module having one light-emitting element and one light-receiving element as optical elements, an optical transmitter module may be employed which has no light-receiving element but plural light-emitting elements. Further, a light-receiving module may be employed which has no light-emitting element but plural light-receiving elements. Furthermore, an optical transmitter/receiver module may be employed which has plural light-emitting elements and plural light-receiving elements. In such a manner, it is of course possible to reduce crosstalk by the same configuration in a variety of embodiments of optical modules having plural optical elements.

A core structure configuring a straight waveguide in the optical waveguide sheet 2A of the optical module 1A of the first embodiment may be applied to the optical waveguide sheet 2B of the optical modules 1B and 1C of the respective second and third embodiments. Similarly, a core structure configuring branching waveguides in the optical waveguide sheet 2B of the optical modules 1B and 1C of the respective second and third embodiments may be applied to the optical waveguide sheet 2A of the optical module 1A of the first embodiment.

Although the optical modules 1A, 1B, and 1C of the embodiments have employed an optical waveguide sheet made of a polymer material as optical signal propagation device, it is clear that an optical signal can be propagated by using a light guide made of a quartz-based material, an optical fiber made of a quartz-based material, an optical fiber made of a plastic, or a combination of these.

Although the optical modules 1A, 1B, and 1C of the embodiments have provided roughly the same height of the plural crosstalk-reducing bonding wires 21, the bonding wires 21 may have different heights in consideration of a spread of electromagnetic radiation generated by the transmission-side bonding wire 19. Further, positions where the bonding wires 21 are respectively connected with the electrode pad may be shifted in a back-and-forth direction.

Although the optical modules 1A, 1B, and 1C of the embodiments have utilized a bonding wire as a crosstalk-reducing shield member, it may be constituted of a thin sheet material having conductivity. However, by utilizing a bonding wire as the shield member, the crosstalk-reducing bonding wire can also be connected in the step of binding wires to electrically connect the surface-type light-emitting element 4 and the surface-type light-receiving element 5, to facilitate a mounting step and enable utilizing of the existing mounting equipment, thereby reducing manufacturing costs.

The present invention is applied to an optical communication module between boards or chips of an electronic device, a connector of a communication cable utilizing an optical fiber, etc. It should be understood by those skilled in the art that various modifications, combinations, sub-combination and alternations may occur depending on design requirements and other factors insofar as they are within the scope of the appended claims or the equivalents thereof.

What is claimed is:

1. An optical module comprising:
   at least two optical elements mounted in parallel with each other;
   a first electrode pad formed between the paralleled optical elements and grounded to a ground potential;
   a second electrode pad arranged along a line that is intersected with a direction in which the optical elements are arranged, said second electrode pad facing the first electrode pad, and said second electrode pad being grounded to the ground potential; and
   a conductive shield member connected to both the first electrode pad and the second electrode pad and positioned between electrical signal transmission paths, each one of which is connected to the optical elements, wherein,
   the shield member includes a linear wire, said wire one end connected to the first electrode pad and the other end thereof connected the second electrode pad, and is stretched between the first electrode pad and the second electrode pad at a height aligned with a height of the electrical signal transmission path connected to the optical elements.

2. The optical module according to claim 1, wherein plural wires are stretched between the first electrode pad and the second electrode pad.

3. The optical module according to claim 1, wherein the wire is made of gold and stretched between the first electrode pad and the second electrode pad by wire bonding.

4. The optical module according to claim 1, further comprising a mounting substrate that mounts the optical element, the paralleled optical elements being mounted on the mounting substrate and the first electrode pad being formed on the mounting substrate.

5. The optical module according to claim 4, further comprising an electric circuit substrate on which the mounting substrate is mounted, wherein the second electrode pad is formed on the electric circuit substrate; and wherein the first electrode pad formed on the mounting substrate is connected to the ground electrode formed on the electric circuit substrate.

6. The optical module according to claim 5, further comprising a grounding electrode that is electrically connected to the first electrode pad on a back surface of the mounting substrate, wherein the grounding electrode is mounted on the ground electrode formed on the electric circuit substrate, to connect the first electrode pad with the ground through the ground electrode and the grounding electrode.

7. The optical module according to claim 6, wherein a conducting electrode that makes the first electrode pad and the grounding electrode conductive to each other is formed on a side surface of the mounting substrate.

8. The optical module according to claim 5, wherein the first electrode pad formed on the mounting substrate is grounded to the ground electrode formed on the electric circuit substrate, by a conductive wire having conductivity.

9. The optical module according to claim 8, further comprising on a surface of the mounting substrate a grounding pad which is conductive to the first electrode pad and to which the wire for grounding is connected, wherein the wire for grounding and the first electrode pad are connected to each other at a position different from a position where the shield member is connected to the first electrode pad.

10. The optical module according to claim 1, further comprising an optical signal transmission device which has a core and a clad to couple the core and the optical elements with each other.

* * * * *

UNITED STATES PATENT AND TRADEMARK OFFICE
CERTIFICATE OF CORRECTION

| | | |
|---|---|---|
| PATENT NO. | : 7,454,104 B2 | Page 1 of 2 |
| APPLICATION NO. | : 11/456730 | |
| DATED | : November 18, 2008 | |
| INVENTOR(S) | : Hidehiko Nakata et al. | |

It is certified that error appears in the above-identified patent and that said Letters Patent is hereby corrected as shown below:

In the Claims:

Claim 1

Column 14, line 26

"intersected with"

should be

--intersected by--

Column 14, line 26

"the optical elements"

should be

--the at least two optical elements--

Column 14, line 33

"connected to the optical elements"

should be

--connected to a respective one of the optical elements--

Signed and Sealed this
Fifteenth Day of September, 2015

Michelle K. Lee
*Director of the United States Patent and Trademark Office*

In the Claims:

Claim 1

Column 14, line 35

"said wire one"

should be

--said linear wire having one--

Column 14, line 40

"the optical elements"

should be

--the at least two optical elements--

Claim 10

Column 16, line 8

"the optical elements"

should be

--the at least two optical elements--